US005796120A

United States Patent [19]

Summers et al.

[11] Patent Number: 5,796,120

[45] Date of Patent: Aug. 18, 1998

[54] TUNNEL THIN FILM ELECTROLUMINESCENT DEVICE

[75] Inventors: Christopher J. Summers, Dunwoody; Brent K. Wagner, Marietta, both of Ga.

[73] Assignee: Georgia Tech Research Corporation, Atlanta, Ga.

[21] Appl. No.: 577,976

[22] Filed: Dec. 28, 1995

[51] Int. Cl.$^6$ .............................. H01L 29/06; H01L 39/00

[52] U.S. Cl. .............................. 257/30

[58] Field of Search .............................. 257/30

[56] References Cited

U.S. PATENT DOCUMENTS

| | | | |
|---|---|---|---|
| 4,081,763 | 3/1978 | Vlasenko et al. | 331/94.5 H |
| 4,095,011 | 6/1978 | Hawrylo et al. | 428/469 |
| 4,170,018 | 10/1979 | Runge | 357/17 |
| 4,416,933 | 11/1983 | Anston et al. | 428/216 |
| 4,418,118 | 11/1983 | Lindors | 428/336 |
| 4,523,189 | 6/1985 | Takahara et al. | 340/781 |
| 4,532,454 | 7/1985 | Abdalla | 313/506 |
| 4,537,826 | 8/1985 | Miyamura et al. | 428/328 |
| 4,988,579 | 1/1991 | Tomomura et al. | 428/690 |
| 5,029,320 | 7/1991 | Kido et al. | 357/17 |
| 5,066,551 | 11/1991 | Kojima | 428/690 |
| 5,086,252 | 2/1992 | Kido | 313/503 |
| 5,099,301 | 3/1992 | Kikinis | 357/41 |
| 5,113,233 | 5/1992 | Kitagawa et al. | 357/17 |
| 5,198,721 | 3/1993 | Kahng et al. | 313/503 |
| 5,200,668 | 4/1993 | Ohashi et al. | 313/498 |
| 5,314,759 | 5/1994 | Harkonen et al. | 428/690 |
| 5,543,237 | 8/1996 | Watanabe | 428/691 |
| 5,648,181 | 7/1997 | Watanabe | 428/689 |

OTHER PUBLICATIONS

Herman, M.A., "High–Field Thin Film Electroluminescent Displays, " Electron Technology, 19, 1/2, pp. 23–58, Institute Technology, Warazawa 1986.

Bringuler, E., "Tentative anatomy of ZnS–type electroluminescence," J. Appl. Phys. 75 (9), 1 May 1994, pp. 4291–4312.

*Primary Examiner*—Tom Thomas
*Assistant Examiner*—Howard Weiss
*Attorney, Agent, or Firm*—Thomas, Kayden, Horstemeyer & Risley, LLP

[57] ABSTRACT

A low voltage tunnel thin film electroluminescent device (10) that comprises a conductive layer (13) that acts as a source of electrons, a first thin barrier layer (14) deposited on the conductive layer, a luminescent layer (16) deposited on the barrier layer a second thin barrier layer (14) deposited on said luminescent layer, and an electrode (18) deposited on the second barrier layer. Electrons from the source layer tunnel through the thin tunnel barrier layer into the luminescent layer which is doped with luminescent centers. The electrons that tunnel through the thin tunnel barrier layer into the luminescent layer have kinetic energy that is within a narrow energy distribution. The material comprising the first barrier layer is preferably chosen to have a positive conduction band off-set (22) with respect to the conductive layer and the material comprising the luminescent layer is chosen to have a negative conduction band off-set (24) with respect to said first barrier layer, wherein the negative conduction band off-set is greater than the positive conduction band off-set. Further, the different material layers are preferably lattice-matched and epitaxially grown in order to make the device more efficient.

27 Claims, 5 Drawing Sheets

TUNNEL THIN FILM ELECTROLUMINESCENT DEVICE

The U.S. Government has a paid-up license in this invention and the right in limited circumstances to require the patent owner to license others on reasonable terms as provided for by the terms of U.S. Government Prime Contract No. F33615-94-C-1511, awarded by the Department of Defense.

FIELD OF THE INVENTION

The present invention generally relates to electroluminescent devices, and more particularly, to a tunnel thin film electroluminescent device that is integrable with silicon or other conductive material and is suitable for use in low voltage, high efficiency electroluminescent displays.

BACKGROUND OF THE INVENTION

As early as 1907, Englishman H. J. Round observed the phenomena of electroluminescence in a semiconductor device. However, up until the last 20 to 30 years, electroluminescent structures received little attention due to their lack of durability and reliability in a practical sense. Beginning in the early 1960's, thin film electroluminescent (TFEL) devices began receiving more and more attention and intense study as science entered the modern electronic age. Particularly, advancements in both integrated circuit technology and microfabrication techniques have been especially significant in the advancement of TFEL structures. Most recently, the interest in TFEL devices has increased even more because of their promising application to head mounted displays for use in automobiles, aircraft, microsurgery, and virtual reality. Further enhancing the appeal of TFEL devices is their ability to be integrated with silicon or other electronic materials and fabricated with microcircuitry in order to develop smart displays.

In its simplest form, a conventional TFEL device comprises a luminescent layer sandwiched between two thick insulating layers. The luminescent layer typically comprises a host material doped with luminescent centers, typically of a rare-earth element such as terbium (Tb), samarium (Sm), cerium (Ce) or a transition metal such as manganese (Mn). In addition, an electrode is attached to the outside of either insulating layer for providing an electric field across the device. In order for light to be emitted from the device, the electrode at the viewing surface of the device should be transparent, and typically comprises an indium tin oxide (ITO) layer. In most instances, the TFEL device is fabricated on a substrate, such as glass.

In operation, an electric field is applied to the luminescent layer by the application of a voltage differential between the respective electrodes. The electric field causes electrons to discharge into the luminescent layer from holes or defects at the interface on the cathode side of the device between the luminescent layer and insulating layer. The discharged electrons are accelerated by the energy received from the electric field, thereby generating hot electrons. The hot electrons migrate in the crystal lattice of the host material in the luminescent layer, eventually colliding with or impacting the luminescent centers, and thereby transferring their energy to the luminescent centers so as to excite them to an elevated state. As the luminescent centers return from the excited state to a ground state, the light is emitted. Following this phenomenon, the discharged electrons are collected at the interface on the anode side of the device between the luminescent layer and the other insulating layer where the electrons recombine with the holes or defects at that interface. The anode and cathode sides of the device are then switched as the voltage is applied in an opposite direction so that the aforementioned process is repeated in the reverse direction. Typically, this process is continuously repeated in alternating fashion in order to produce the appearance of a constant light source.

In the process described above, it is known in the art that the discharge of electron from the interface between an insulating layer and a luminescent layer is determined by a variety of factors such as the density of states and the energy distribution, etc., of the interface and that the interface density of states and the energy distribution, etc., depend upon the materials, crystal properties, fabrication techniques, etc., of the insulating and luminescent layers. With conventional materials and fabrication techniques, TFEL devices typically require an applied voltage of between 150 and 250 volts to create an electric field sufficient to discharge the electrons from the interface on the cathode side of the device into the luminescent layer. This is largely due to the relative thickness of these devices, and more particularly the insulating layers, because the electric field across the device is inversely proportional to the thickness of the device, that is, field=voltage/distance. Further, the discharged electrons generally have a broad energy distribution. This results in inefficiency because many of the electrons at the lower end of the energy distribution never gain enough energy to impact excite a luminescent center yet they do absorb energy from the applied electric field.

In addition, because the number of electrons discharged from the interface is limited by the physical characteristics of the interface, i.e., the defect state density, these devices are not capable of operating under direct current (d.c.) because once all the electrons have been discharged from the interface on the cathode side of the device and collected at the interface on the anode side, the device stops emitting light. This is overcome by operating the TFEL device in an alternating current (a.c.) mode whereby the electrons repeatedly travel back and forth between the interfaces as the field is continuously being reversed. However, in portable applications, a.c. driven display devices usually require complex and expensive driving circuitry in order to convert the d.c. power supply into an a.c. power source of sufficient voltage to cause the electrons to discharge.

An arrangement aimed at overcoming some of the above-identified deficiencies in conventional TFEL devices is disclosed in U.S. Pat. No. 5,066,551 of Kojima, which discloses a TFEL configuration that introduces a greater number of electrons into the luminescent layer than previously available in the aforementioned configuration. The device disclosed in U.S. Pat. No. 5,066,551, is substantially similar to the TFEL device described above, having a luminescent layer sandwiched between two insulating layers and two electrodes respectively. Added to the conventional TFEL device by U.S. Pat. No. 5,066,551 are two intermediate electrodes and two thin insulating layers disposed on either side and adjacent to the luminescent layer, between the luminescent layer and the insulating layer. Accordingly, as a voltage differential is applied across the electrodes to create an electric field, electrons are discharged from the interface between the insulating layer and the luminescent layer. In most conventional TFEL devices, this is the sole source of electrons. In U.S. Pat. No. 5,066,551, however, additional electrons are injected into the luminescent layer from the intermediate electrode by tunnel emission through the insulating layer.

An apparent advantage to this configuration is that electrons supplied by the intermediate electrode are injected into the luminescent layer as hot electrons having kinetic energy, thereby improving the exciting efficiency of the luminescent centers. A disadvantage of this design is that it is only functional in an a.c. mode because the number of electrons is limited to those existing between the two thick insulating layers, i.e., the electron at the interface of the thin insulating layer and the luminescent layer and the electrons from the intermediate electrode. Thus, in a d.c. operating mode, all the available electrons will eventually travel through the luminescent layer to the interface at the anode side of the device, ending the emission of light from the device. Further, this is considered to be a high voltage device because the operating voltage required to create an adequate electric field across the device is relatively high due to the overall thickness of the device.

A drawback to high voltage TFEL devices, as virtually all conventional TFEL devices are, is that they require complex and expensive drive circuitry to operate. This is a considerable deterrent to the widespread use of TFEL devices in the extremely competitive market of displays because the cost of manufacture is a primary concern. This disadvantage is even greater when the TFEL device only operates in an a.c. mode but is powered by an a.c. source since such a TFEL device would require even more complex and expensive drive circuitry, as discussed above. Further, high voltage devices are generally incompatible with fabrication on the relatively inexpensive silicon on the insulator (SOI) substrates which utilize only a thin layer of silicon deposited over a less expensive substrate material such as sapphire because the high operating voltage causes electrical breakdown across the thin silicon layer.

Hence, a heretofore unaddressed need exist in the industry for an efficient, low voltage TFEL device that can operate in either an a.c. or d.c. mode.

SUMMARY OF THE INVENTION

An object of the present invention is to overcome the deficiencies and inadequacies in the prior art as described above and as generally known in the industry.

Briefly described, the present invention is a low voltage, tunnel TFEL device highly suitable for use in the production of lightweight, multi-color, head mounted or panel displays. A TFEL device in accordance with the present invention comprises a conductive layer such as silicon that acts as a source of electrons, a first thin barrier layer deposited on the conductive layer, a luminescent layer deposited on the first barrier layer, a second thin barrier layer deposited on the luminescent layer, and an electrode deposited on the second insulating layer. By selectively choosing the materials that comprise the conductive layer, the thin barrier layer, and the luminescent layer so that the respective layers have favorable conduction band off-sets with respect to one another, the electrons that leave the conductive layer, and tunnel through the thin barrier layer, enter the luminescent layer with kinetic energy. Thus, a TFEL device in accordance with the present invention has an operating voltage that is dramatically lower than the prior art TFEL devices because less energy is required to excite the electrons to an elevated state.

In order to achieve the favorable conduction band off-sets of the present invention, the material comprising the first barrier layer is chosen to have a positive conduction band off-set with respect to the conductive layer and the material comprising the luminescent layer is chosen to have a negative conduction band off-set with respect to the first barrier layer such that the negative conduction band off-set is greater than the positive conduction band off-set. Thus, the tunneling electrons enter the luminescent layer with energy received from the cumulative conduction band off-set. Known material combinations having such favorable conduction band off-sets between the conductive layer/barrier layer/luminescent layer include Si/$CaF_2$/ZnS (doped with luminescent centers) or GaAs/$BaF_2$/ZnSe (doped with luminescent centers).

In addition, the present invention departs from traditional TFEL device configurations to lower the operating voltage of the device further by eliminating the thick insulating layers disposed on both sides of the luminescent layer and replacing them with thin tunnel barrier layers. As described in the foregoing, the conductive layer acts as an electron source layer that provides an essentially endless supply of electrons to tunnel through the barrier layer into the luminescent layer, all within a narrow energy distribution.

By removing the thick insulating layers and making the device thinner, only a small voltage need be applied to the device in order to create a sufficient electric field to cause the electrons from the source layer to tunnel through the barrier layer into the luminescent layer, and thereby produce luminescence. Because the operating voltage is low, the electrons at the interface between the barrier layer and the luminescent layer are not discharged so that essentially none of the energy of the applied electric field is absorbed by the electrons that typically never become hot electrons. The device can be made even more efficient by lattice-matching the materials and growing them epitaxially upon one another in order to reduce the defect density state at the interfaces of the respective materials.

In a first alternative embodiment, the luminescent layer of a tunnel TFEL is only doped in a central region in order to provide exterior regions of intrinsic host material in which an excited electron can accelerate before colliding with a luminescent center in the doped region. In a second alternative embodiment, the doped central region of the first alternative embodiment comprises multiple layers doped with different elements that produce respective colors so that the colors combine to produce a desired color. In this embodiment, layers of intrinsic host material can also be interposed between the doped regions to provide acceleration regions between the doped regions.

The present invention can also be thought of as a method for fabricating a low voltage tunnel thin film electroluminescent device comprising the steps of: (a) forming a substrate with a top layer that includes a conductive layer that functions as an electron source layer; (b) depositing a first barrier layer over the conductive layer; (c) depositing a luminescent layer over the first barrier layer; (d) depositing a second barrier layer over the luminescent layer; and (e) depositing an electrode over the second barrier layer.

An advantage of the present invention is that it is a tunnel TFEL device that can be constructed on less expensive SOI substrates.

Another advantage of the present invention is that it is a tunnel TFEL device that does not require the complex and costly drive circuitry of high voltage, alternating current TFEL devices.

Yet another advantage of the present invention is that it is a tunnel TFEL with high efficiency, high resolution, high contrast and high brightness.

Other objects, features, and advantages of the present invention will become apparent to one skilled in the art from the following description when considered in conjunction with the accompanying drawings.

BRIEF DESCRIPTION OF THE DRAWINGS

The present invention, as defined in the claims, can be better understood with reference to the following drawings. The drawings are not necessarily to scale, emphasis instead being placed upon clearly illustrating the principles of the present invention.

DETAILED DESCRIPTION OF THE PREFERRED EMBODIMENT

1. Device Structure

Figure 1:
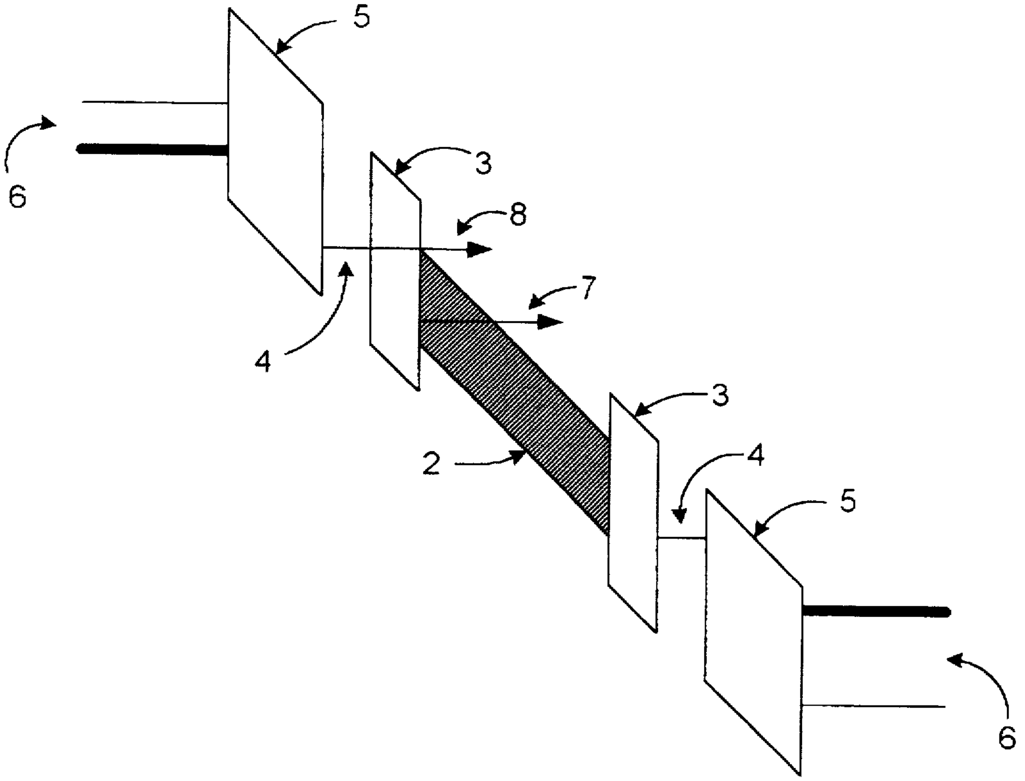
Fig. 1 (Prior Art)
FIG. 1 is a schematic illustration of an energy band diagram of a prior art TFEL device.

FIG. 1 discloses an energy band diagram for the Kojima arrangement as discussed hereinbefore. As shown, a luminescent layer 2 is sandwiched between two thin insulating layers 3 and two intermediate electrodes 4. The foregoing structure is further sandwiched by two thick insulating layers 5 and two electrodes 6. In the Kojima arrangement, the electrons entering the luminescent layer 2 come from the defect states at the interface layer 3 and the luminescent layer 2, indicated by reference numeral 7, and from the intermediate electrode 4 via tunnel emission through the thin barrier layer 3.

Figure 2:
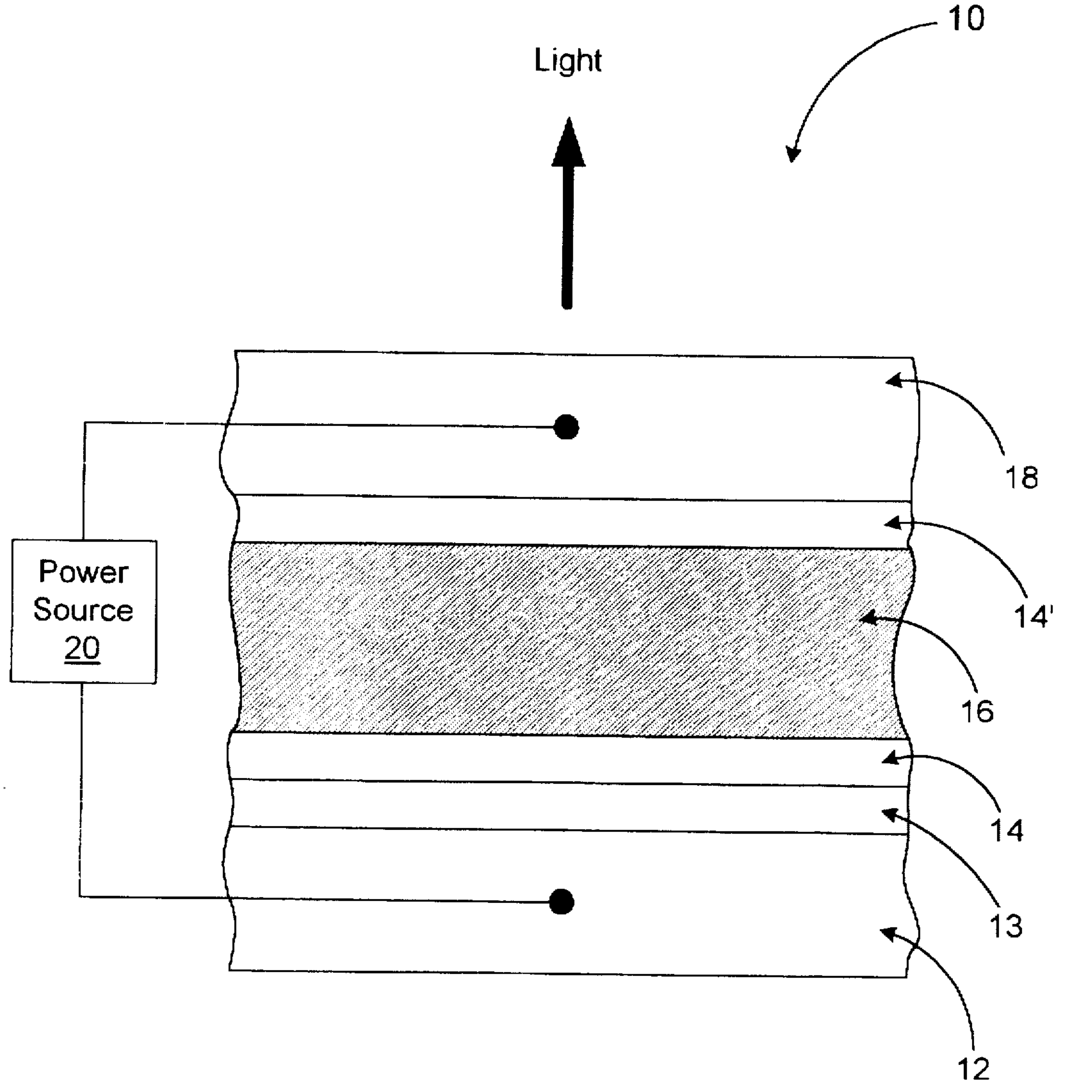
FIG. 2 is a cross-sectional view of a tunnel TFEL device embodying the invention.

With further reference to the drawings wherein like reference numerals represent corresponding parts throughout the several views, FIG. 2 illustrates a cross-sectional view of a portion of a tunnel thin film electroluminescent (TFEL) device 10 in accordance with the present invention. The device 10 represents a novel scheme for implementing a tunnel TFEL device on a substrate 12 comprising silicon or another conductive metal, wherein the silicon or conductive substrate supplies electrons that tunnel through a thin barrier layer 14 into a luminescent layer 16. The materials utilized are specifically selected such that the relationships of their conduction bands produces an off-set in energy so the electrons tunneling through the barrier layer enter the luminescent layer "hot", that is, with a high kinetic energy approximately tuned to the impact excitation threshold of the luminescent centers in the luminescent layer. Further, the materials comprising the respective layers of the device are preferably lattice-matched and grown epitaxially in order to increase the efficiency by making the device a single crystal structure. Accordingly, the tunnel TFEL device 10 is a low voltage, low power electroluminescent device with higher efficiency, brightness and resolution than conventional electroluminescent devices. In addition, because device 10 can be directly integrated with silicon or semiconducting materials such as gallium arsenide (GaAs), device 10 can be fabricated with integrated circuit microfabrication techniques which are well known and widely used in the art.

Referring to FIG. 2, device 10 comprises the silicon substrate 12 over which a conductive electron source layer 13 is deposited. The source layer 13 is preferably either silicon or gallium arsenide doped with electrons or holes so as to be n- or p-typed. Alternatively, substrate 12 can be doped in order to function as an electron source layer, and thus, eliminating the need for source layer 13. Further, as can be appreciated by one skilled in the art, substrate 12 may include integrated circuits over which device 10 may be fabricated and which may be used to drive device 10.

Deposited over source layer 13 is a first thin crystalline barrier layer 14 of a material preferably latticed-matched to the source layer 13 and having a conduction band energy level above that of the source layer 13. It has been found that, when silicon is utilized for the source layer 13, a suitable material for barrier layer 14 is calcium difloride ($CaF_2$). Another suitable material for barrier layer 14 that is lattice matched with silicon is cerium oxide (CeO).

Overlying the first barrier layer 14 is a luminescent layer 16 that comprises a high quality host material doped with luminescent centers. The host material is typically chosen from Group II–VI compound semiconductors. In the preferred embodiment, zinc sulfide (ZnS) is used as the host material because of its conductive band energy level that is below that of the calcium difloride utilized for the barrier layer 14. The luminescent centers, or active material, are typically chosen from the transition metals or rare-earth elements such as manganese (Mn) or terbium (Tb).

Deposited over luminescent layer 16 is a second thin crystalline barrier layer 14' substantially identical to the first barrier layer 14'. A transparent electrode 18 is further deposited adjacent second barrier layer 14. Transparent electrode 18 can take many forms such as a thin layer of silicon or a thin layer of indium tin oxide (ITO). Though not shown with device 10, an additional thin, transparent electron source layer of silicon may be incorporated between second barrier layer 14' and electrode 18 to enhance performance when operating in an a.c. mode.

A power source 20 is provided to create a voltage differential across device 10 between electrode 18 and substrate 12. Because of the high concentration of electrons available in source layer 13 (or alternatively, substrate 12), device 10 is suitable for operation in either an a.c. or d.c. mode. If operating in a d.c. mode, device 10 can be modified by removing second barrier layer 14' adjacent electrode 18 since the symmetry provided by the second barrier layer 14' is not required in d.c. operation because the electrons travel in only one direction.

Figure 3:
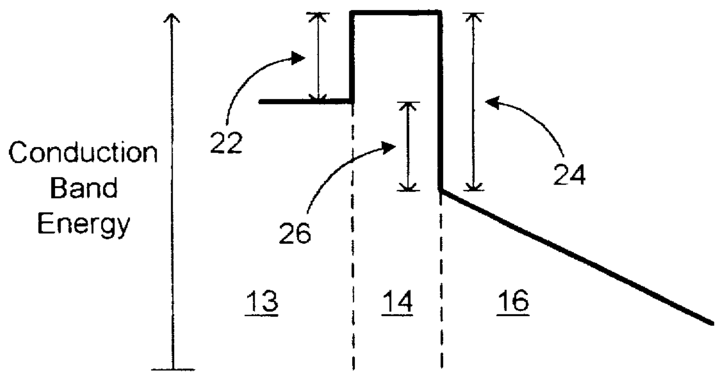
FIG. 3 is a graphical illustration of a conductive band energy diagram of the device of FIG. 2.

Worth noting at this point is the design consideration given the choice of materials for source layer 13, barrier layers 14, 14', luminescent layer 16 and electrode 18. For the purpose of brevity, only the relationships of source layer 13, first barrier layer 14', and luminescent layer 16 are discussed though the principles and concepts discussed herein are applicable to the relationship between luminescent layer 16, second barrier layer 14', and electrode 18. As illustrated in FIG. 3, the material utilized for barrier layer 14 preferably has a positive conduction band off-set 22 with respect to source layer 13. In addition, luminescent layer 16 preferably has a negative conduction band off-set 24 with respect to barrier layer 14. Thus, the cumulative or net conduction band off-set 26 is negative, or stated differently, the negative conduction band off-set 24 is greater than the positive conduction band offset 22. As previously mentioned, such favorable conduction band off-sets are achieved by utilizing silicon for the source layer 13, $CaF_2$ for the barrier layer 13 and ZnS for the host material in the luminescent layer 16. Alternatively, it is known that the combination of GaAs for the source layer 13, $BaF_2$ for the barrier layer 14, and ZnSe for the host material in the luminescent layer 16 is likewise suitable. By the aforementioned configuration, kinetic energy is imparted to the electrons that tunnel through barrier layer 14 so that they possess a discernable amount of kinetic energy as they enter luminescent layer 16. Consequently, less voltage need be applied across substrate 12 and electrode 18 in order to produce luminescence. In fact, voltages as low as 15 volts have produced luminescence in a TFEL device in accordance with the present invention as compared with operating voltages between 150–250 volts in the prior art, as elaborated upon in greater detail below. However, as can be appreciated by one of ordinary skill in the art, further optimization of the device should bring about even lower operating voltages by including multiple composite layers that are either lattice-matched or pseudo-morphically strained to the respective layers 13, 16.

2. Operation

In operation, an electric field is applied to the device 10 by the power source 20. As previously stated, driving circuitry can be integrated into substrate 12 in order to provide and control the electric field across the device 10 so as to create a smart display. Under the applied electric field, the forward biased electrons are injected from source layer 13 into the luminescent layer 16 by tunnel emission through first barrier layer 14.

Figure 4:
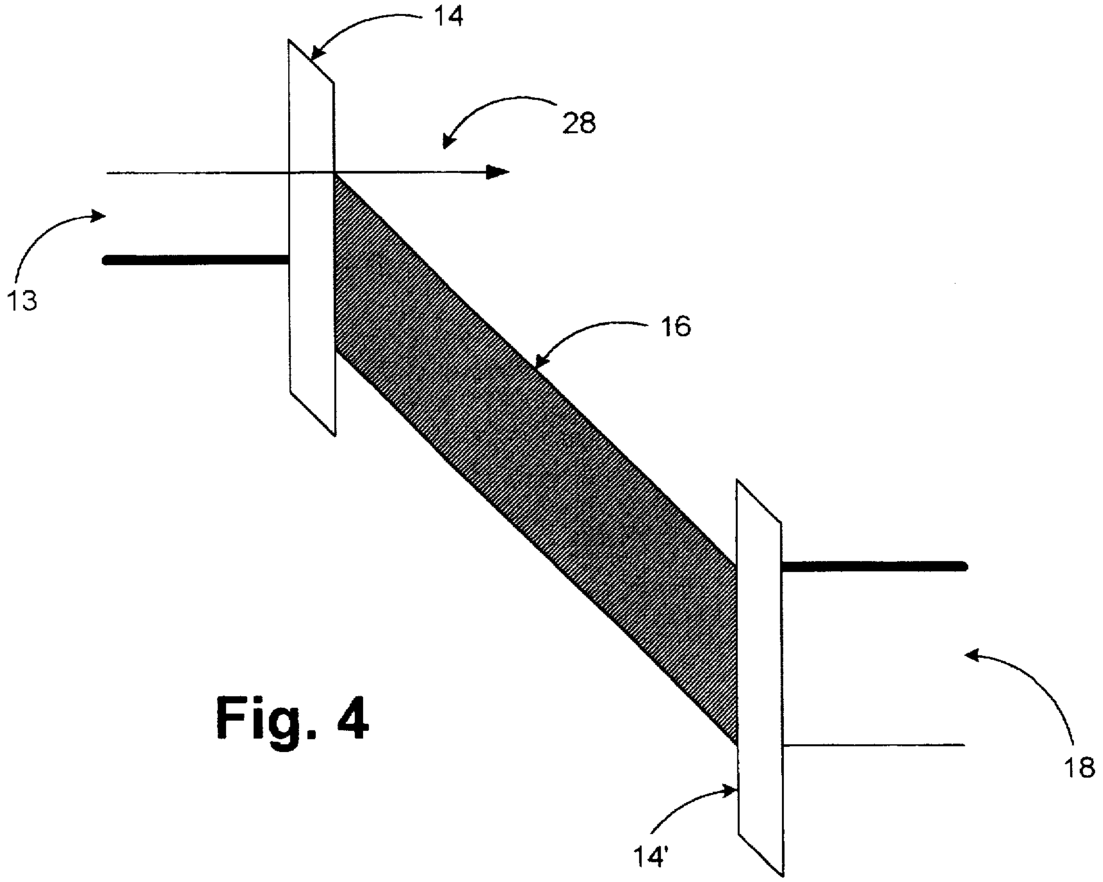
FIG. 4 is a schematic illustration of an energy band diagram of the device of FIG. 2.

With reference to FIG. 4, an energy-band diagram of device 10 graphically illustrates the electrons 28 that tunnel through barrier layer 14. These electrons 28 have kinetic energy as a result of the cumulative conduction band energy off-set 26, as discussed above and illustrated in FIG. 3. Thus, the electrons 28 are essentially "hot" as they enter the luminescent layer 16, and have energies sufficient to impact excite the luminescent centers to their excitation threshold. As the excited luminescent centers return to a ground state, light is emitted. Depending upon the particular elements chosen as the luminescent centers and/or the use of filters, the light emitted will be of a particular color(s). As electrons continue to travel through the luminescent layer 16 toward the second barrier layer 14', they are either collected at the interface between the luminescent layer 16 and the second barrier layer 14' or they tunnel through the second barrier layer 14' into the electrode 18 where they recombine with holes. If a second source layer is incorporated, the electrons tunneling through the second barrier layer 14' will enter the second source layer and recombine with holes therein.

Figure 5:
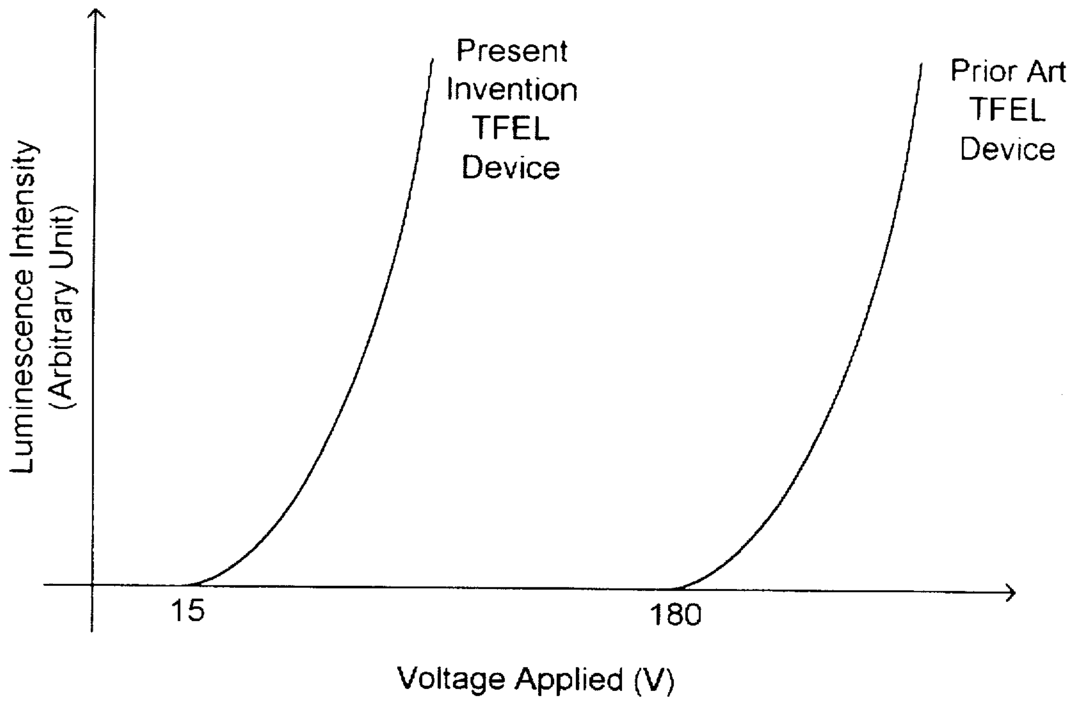
FIG. 5 is a graphical illustration of the luminescence intensity of a tunnel TFEL device in accordance with the present invention with that of a prior art TFEL device.

Because of the energy imparted to the electrons 28 that tunnel through barrier layer 14, device 10 is capable of operating at relative low voltages on the order of 15 volts or less in a polycrystalline structure. This is graphically illustrated in FIG. 5 where the luminescent intensity is plotted against the applied voltage for the device 10 and a typical prior art TFEL device. As illustrated in FIG. 5, the device 10 provides a tremendous advantage over the prior art TFEL devices by operating at ½ the voltage. Several of the advantages of such a low voltage TFEL device include operability with less expensive and less complex CMOS drive circuitry, lower power consumption, and ability to be fabricated on a SOI substrate.

Figure 6:
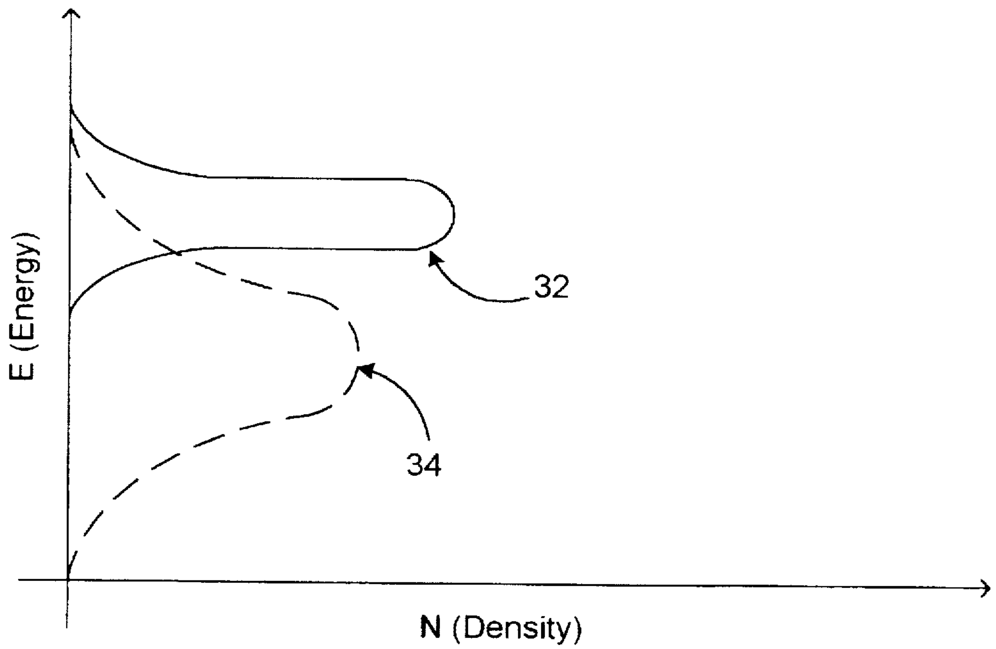
FIG. 6 is a graphical comparison of the energy distributions of the device of FIG. 2 as compared to the prior art device of FIG. 1.

Another feature of the present invention is that the operating voltage is never high enough to discharge the electrons at the interfaces of the luminescent layer 16 and the first and second barrier layers 14, 14'. As a result, the energy distribution of device 10 can be more narrowly tuned to the impact excitation energy threshold of the luminescent centers in layer 16, as graphically illustrated by distribution 32 in FIG. 6. For comparison purposes, an energy distribution 34 of a typical prior art TFEL device such as the one illustrated in FIG. 1 is also provided in FIG. 6. As illustrated in FIG. 6, the prior art TFEL device has a much broader energy distribution which is less efficient, and therefore, requires a higher operating voltage to provide the same amount of illumination as device 10.

Further, by lattice-matching the first barrier layer 14 and the luminescent layer 16, and by epitaxially growing the luminescent layer 16 on the barrier layer 14, the device will possess a low density of interface states between the barrier layer 14 and the luminescent layer 16. Accordingly, the device 10 does not experience, to any noticeable degree, the negative affect of any electrons discharged into the luminescent layer 16 from the interface of the barrier layer 14 and the luminescent layer 16, as experienced by the prior art device illustrated in FIG. 1 and denoted by reference numeral 7 therein. Accordingly, in the present invention, essentially all the electrons injected into luminescent layer 16 in device 10 come from the source layer 13. This produces a very narrow and focused energy distribution. Thus, the narrow energy distribution of the present invention produces more electrons in a "hot" state that have sufficient energy to impact excite the luminescent centers in the luminescent layer 16. This, in effect, means less energy is required to heat the electrons to energies above the impact excitation threshold energy of the luminescent centers resulting in a more efficiently operating electroluminescent device capable of operating at voltages and powers much lower than conventional TFEL devices.

3. Alternative Embodiments

Figure 7A:
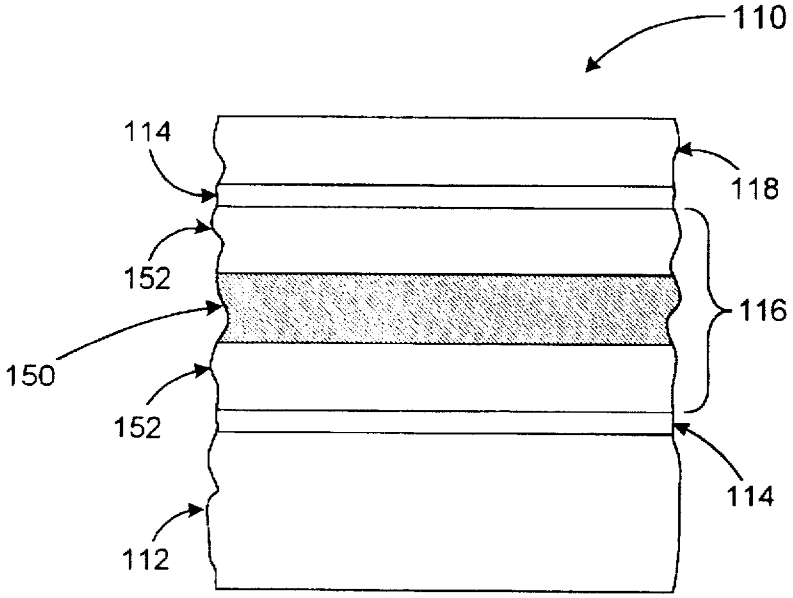
FIG. 7A and 7B are alternative embodiments of a tunnel TFEL device embodying the present invention.
Figure 7B:
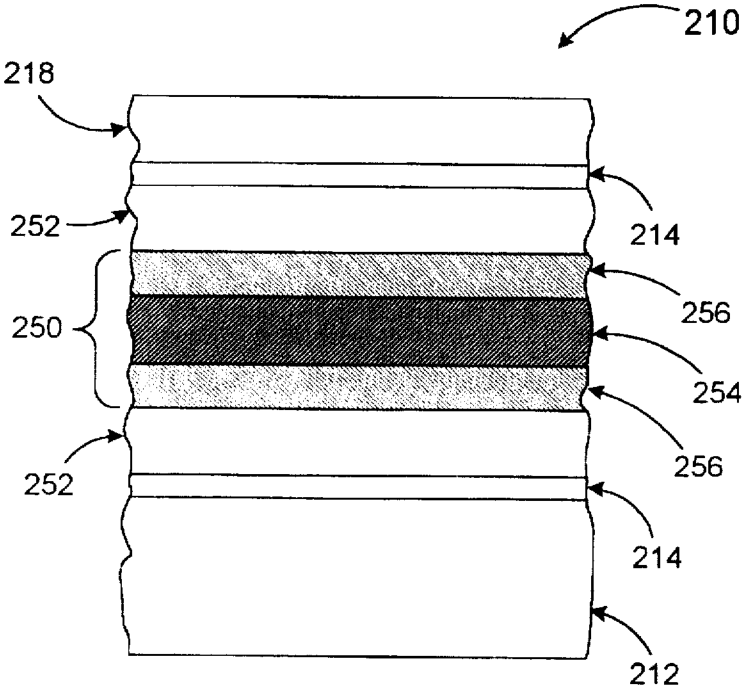

Illustrated in FIGS. 7A and 7B are alternative embodiments of the present invention. A tunnel TFEL device 110, illustrated in FIG. 7A, is substantially similar to the device 10 with the exception that the luminescent layer 116 comprises a central doped region 150 sandwiched by two regions 152 of intrinsic host material. The incorporation of the intrinsic host material regions 152 provide a longer carrier mean free path for the electrons that tunnel through barrier layer 114, enhancing the ballistical acceleration of these electron to ensure an even greater number of electrons have sufficient energies to impact excite the luminescent centers. This enhances the efficiency of the device 110 by reducing the power required to heat the electrons to energies above the impact excitation threshold energy, and thus provides an energy distribution even more narrowly tuned to the impact excitation energy and provides a more deterministic and efficient impact excitation process.

Another alternative embodiment to the present invention is a tunnel TFEL device 210 illustrated in FIG. 7B, wherein doped region 250 comprises a central sub-region 254 doped with a first element sandwiched between two additional sub-regions 256, 258 doped with a second element and a third element respectively. Thus, the combination of the light emitted from the doped sub-regions 254, 256 produces a predetermined, programmed customized color. For example, when ZnS is host material, white light can be produced by utilizing thulium (Tm) as the first element, terbium (Tb) as the second element, and maugunese (Mn) as the third element. Moreover, layers of intrinsic host material can be interposed between sub-regions 254, 256 in order to provide longer carrier mean free paths for the electron prior to entering a doped sub-region.

The alternative embodiments disclosed herein should not be considered exhaustive configurations of a tunnel TFEL device in accordance with the present invention. These presented embodiments are merely illustrative of the numerous embodiments possible.

4. Method Of Fabrication

The present invention also provides and can be conceptualized as a method for fabricating a tunnel TFEL device in accordance with the present invention. Such a method would essentially comprise the steps described hereinafter though it is worth noting that the steps may be implemented with any number of known microfabrication techniques such as metal organic molecular beam epitaxy (MOMBE), molecular beam epitaxy (MBE), chemical vapor deposition (CVD), or liquid phase deposition (LPD). However, the techniques used should be temperature compatible with any underlying integrated drive circuits. Further, it is preferable to utilize materials that are closely lattice-matched so that the layers can be epitaxial. By utilizing materials that are lattice-matched, the disruption in the registration of one lattice with another across an interface of two material layers is minimized. This improves the crystalline qualities of the device which means improved bonds at the interfaces and reduced number of interface defect states.

For purposes of illustrating the present invention, the preferred materials are Si for the conductive or source, layer 12, $CaF_2$ for the barrier layer 13, and doped ZnS for the luminescent layer 16. An alternative combination comprises GaAs for the conductive layer, $BaF_2$ for the barrier layer, and doped ZnSe for the luminescent layer. However, numerous other suitable combinations may be chosen by one of ordinary skill in the art based upon the present disclosure.

Initially, a substrate 12, preferably of silicon, upon which the device is to be constructed, is provided. The silicon substrate is prepared by first cleaning its surface with an RCA procedure, as well known in the industry and described in, for instance, W. Kern, "RCA Review," Vol. 31, pp. 207–264 (1970). The substrate is then loaded into a vacuum chamber to remove the oxide layer thereon because the oxide is amorphous and can act as an insulator. The surface oxide is removed in a controlled manner to produce an atomically flat and smooth surface by heating the substrates to 770° C. under a disilane flux until the removal of the oxide is confirmed by insitu reflection high energy electron diffraction (RHEED) measurements and the observation of a sharp RHEED pattern. This step is necessary to obtain a planar defect free surface. Next, a thin epitaxial layer 13 of silicon is then grown on the substrate while lowering the substrate temperature to about 550° C. This layer may range anywhere from 1 to 500 Å thick and functions as a source layer of electrons which are injected into the luminescent layer 16.

A thin crystalline barrier layer 14 of lattice-matched $CaF_2$ is then deposited over the electron source layer. Specifically, the disilane flux is terminated and a flux of $CaF_2$ immediately initiated. The growth of barrier layer 14 continues at temperatures of 500°–550° C. for 2–10 minutes in order to grow the barrier layer of $CaF_2$ to a thickness between 20–100 Å. This thickness controls the voltage threshold and the injection current of the device. Further, the thickness of this layer must be precisely controlled to prevent shorts between the conductive layer 13 and the luminescent layer 16.

A luminescent layer 16 of high quality lattice-matched ZnS is deposited on the thin insulating layer. Preferably, the luminescent layer 16 is grown via chemical beam epitaxy (CBE) using DeZn and $H_2S$ gas sources at a substrate temperature of 240° C. To initiate growth and to obtain a high quality interface, the luminescent layer 16 is first seeded using a diisopropyl sulfide (DipS) gas source cracked to produce monomer sulfur. This layer is doped at this time with luminescent centers such as Mn, Tb or other rare-earth or transition metals which are able to produce a variety of luminescent colors. The whole luminescent layer can be doped or, as previously discussed, only a central portion of the layer may be doped so that the electrons have an acceleration region in the intrinsic ZnS region before entering the doped region. Further, multiple intermediate doped layers of various elements can be incorporated into the luminescent layer in order to produce a desired color.

A second thin insulating or barrier layer 14 is then deposited on the luminescent layer. This layer is substantially identical to the first insulating layer described above. This layer is preferably fabricated by quickly ramping the substrate temperature to 400° C. under a $CaF_2$ flux for 2–10 minutes. It is believed that by enclosing the ZnS layer with the $CaF_2$ barrier layers, the diffusion of sulfur at the interfaces is inhibited, and thus, reducing the brightness-voltage instabilities associated therewith. If the device is to be operated in only a d.c. mode, the second insulating layer can be omitted in order to reduce the overall thickness of the device, and thereby reduce the operating voltage.

Lastly, a transparent electrode, preferably a thin ITO layer, is deposited on the second thin insulating layer. In an a.c. operating mode, this electrode can act as an electron source layer much like the source layer under a reversed field. Alternatively, a second electron source layer may be deposited between the second barrier layer and the electrode in order to provide a source of electrons under a reversed field, i.e., in a.c. mode operation. The additional source layer is not required for a.c. mode operation but may improve device efficiency in a.c. mode operation.

It would be obvious to those skilled in the art that modifications or variations may be made to the embodiments described herein without departing from the novel teachings of the present invention. All such modifications and variations are intended to be incorporated herein and within the scope of the following claims.

We claim:

1. A tunnel thin film electroluminescent device, comprising:

a source layer;

a first tunneling barrier layer contiguously overlying said source layer, said first tunneling barrier layer having a positive conduction band off-set with respect to said source layer;

a luminescent layer contiguously overlying said first tunneling barrier layer, said luminescent layer having a negative conduction band off-set with respect to said first tunneling barrier layer, said negative conduction band off-set being greater than said positive conduction band off-set;

a second tunneling barrier layer overlying said luminescent layer; and an electrode overlying said second tunneling barrier layer;

whereby a voltage placed across said source layer and said electrode produces luminescence in said device.

2. The electroluminescent device of claim 1, wherein at least one of said device layers is epitaxially formed.

3. The electroluminescent device of claim 1, wherein said source layer, said first tunneling barrier layer and said luminescent layer are latticed-matched.

4. The electroluminescent device of claim 1, wherein said luminescent layer comprises a layer of host material doped with luminescence centers interposed between respective layers of intrinsic host material.

5. The electroluminescent device of claim 1, wherein said luminescent layer comprises a plurality of layers of host material doped with luminescence centers, each said doped layer interposed between respective layers of intrinsic host material.

6. The electroluminescent device of claim 1, further comprising a layer of p- or n-type doped host material deposited between said second tunneling barrier layer and said electrode so as to be a source of electrons.

7. The electroluminescent device of claim 1, wherein said first tunneling barrier layer is between about 10–50 Å thick.

8. The electroluminescent device of claim 4, wherein said luminescent centers are rare-earth elements or transition metals.

9. The electroluminescent device of claim 1, wherein said source layer is doped n-type or p-type silicon.

10. The electroluminescent device of claim 1, wherein said second tunneling barrier layer has a positive conduction band off-set with respect to said luminescent layer.

11. The electroluminescent device of claim 1, wherein said luminescent layer includes host material doped with luminescent centers.

12. A tunnel thin film electroluminescent device integrable with silicon and operable at low voltages, comprising:

a silicon substrate doped with electrons;

a tunneling barrier layer of single crystal material having a positive conduction band off-set with respect to said silicon substrate, said tunneling barrier layer deposited adjacent to said silicon substrate;

a luminescent layer including a host material and luminescent centers, said luminescent layer disposed adjacent said tunneling barrier layer; and a transparent electrode deposited adjacent said luminescent layer.

13. A tunnel thin film electroluminescent device, comprising:

a source layer;

a first tunneling barrier layer contiguously overlying said source layer, said first tunneling barrier layer having a positive conduction band off-set with respect to said source layer;

a luminescent layer contiguously overlying said first tunneling barrier layer, said luminescent layer having a negative conduction band off-set with respect to said first tunneling barrier layer, said negative conduction band off-set being greater than said positive conduction band off-set; and an electrode overlying said luminescent layer.

14. The tunnel thin film electroluminescent device of claim 13, wherein said device is adapted to conduct electrical current from said source layer to said electrode, through said first tunneling barrier layer and said luminescent layer when a voltage is applied across said source layer and said electrode.

15. The tunnel thin film electroluminescent device of claim 14, wherein said voltage is DC voltage and said electrical current is direct current.

16. The tunnel thin film electroluminescent device of claim 13, further comprising a second tunneling barrier layer between said luminescent layer and said electrode.

17. The tunnel thin film electroluminescent device of claim 16, wherein said device is adapted to conduct electrical current from said source layer to said electrode, through said first and second tunneling barrier layers and said luminescent layer when a voltage is applied across said source layer and said electrode.

18. The tunnel thin film electroluminescent device of claim 17, wherein said voltage is DC voltage and said electrical current is direct current.

19. The tunnel thin film electroluminescent device of claim 17, wherein said voltage is AC voltage and said electrical current is alternating current.

20. The tunnel thin film electroluminescent device of claim 13, wherein said source layer further comprises a doped substrate.

21. The tunnel thin film electroluminescent device of claim 13, wherein said source layer further comprises:

a substrate; and a doped source layer disposed between said substrate and said first thin barrier layer.

22. The tunnel thin film electroluminescent device of claim 13, wherein said source layer further comprises integrated circuits.

23. A tunnel thin film electroluminescent device, comprising:

a source layer;

a first tunneling barrier layer overlying said source layer, said first tunneling barrier layer having a positive conduction band off-set with respect to said source layer;

a luminescent layer overlying said first tunneling barrier layer, said luminescent layer having a negative conduction band off-set with respect to said first tunneling barrier layer, said negative conduction band off-set being greater than said positive conduction band off-set; and an electrode overlying said luminescent layer, wherein a voltage source applied across said source layer and said electrode causes electrical current to flow from said source layer to said electrode, through all layers between said source layer and said electrode.

24. The tunnel thin film electro-luminescent device of claim 23, wherein said voltage is DC voltage and said electrical current is direct current.

25. The tunnel thin film electroluminescent device of claim 23, further comprising a second tunneling barrier layer between said luminescent layer and said electrode.

26. The tunnel thin film electroluminescent device of claim 25, wherein said voltage is DC voltage and said electrical current is direct current.

27. The tunnel thin film electroluminescent device of claim 25, wherein said voltage is AC voltage and said electrical current is alternating current.

* * * * *